United States Patent
Yang

(10) Patent No.: US 11,388,838 B2
(45) Date of Patent: Jul. 12, 2022

(54) FAN MODULE AND ELECTRONIC DEVICE

(71) Applicant: Wistron Corporation, New Taipei (TW)

(72) Inventor: Qi-Hong Yang, New Taipei (TW)

(73) Assignee: Wistron Corporation, New Taipei (TW)

( * ) Notice: Subject to any disclaimer, the term of this patent is extended or adjusted under 35 U.S.C. 154(b) by 92 days.

(21) Appl. No.: 16/892,300

(22) Filed: Jun. 4, 2020

(65) Prior Publication Data

US 2021/0321532 A1   Oct. 14, 2021

(30) Foreign Application Priority Data

Apr. 8, 2020   (TW) .................................. 109111702

(51) Int. Cl.
*H05K 7/20* (2006.01)
*F04D 25/14* (2006.01)
(Continued)

(52) U.S. Cl.
CPC ......... *H05K 7/20172* (2013.01); *F04D 25/14* (2013.01); *F04D 29/526* (2013.01);
(Continued)

(58) Field of Classification Search
CPC .......... H05K 7/20172–20181; H05K 7/20727; F04D 25/14; F04D 29/646
See application file for complete search history.

(56) References Cited

U.S. PATENT DOCUMENTS 7,075,788 B2 * 7/2006 Larson ...................... G06F 1/20
    174/16.3
7,079,387 B2 * 7/2006 Brooks ...................... G06F 1/20
    165/185
(Continued)

FOREIGN PATENT DOCUMENTS

| CN | 201216045 | 4/2009 |
| CN | 103133418 | 6/2013 |

(Continued)

OTHER PUBLICATIONS

"Office Action of Taiwan Counterpart Application", dated Feb. 2, 2021, p. 1-p. 9.
(Continued)

*Primary Examiner* — Robert J Hoffberg
(74) *Attorney, Agent, or Firm* — JCIPRNET

(57) ABSTRACT

A fan module including a blade mechanism, a switch component, and a fan is provided. The blade mechanism includes a frame having a through hole, a positioning bracket movably connected to the frame, and blades movably connected to the positioning bracket and the frame. The switch component is connected to the positioning bracket and located on an assembly path. The fan is detachably disposed at one side of the through hole, and the positioning bracket and the blades are located at another side. In a first mode, any two adjacent blades are stacked to close the through hole. In a second mode, the fan pushes the switch component to drive the positioning bracket to drive the blades, such that the blades have a rotational degree of freedom relative to the positioning bracket or rotate relative to the frame to open the through hole. An electronic device is also provided.

20 Claims, 13 Drawing Sheets

(51) Int. Cl.
*F04D 29/52* (2006.01)
*F04D 29/64* (2006.01)
*F04D 19/00* (2006.01)

(52) U.S. Cl.
CPC ....... *F04D 29/646* (2013.01); *H05K 7/20181* (2013.01); *H05K 7/20727* (2013.01); *F04D 19/002* (2013.01)

(56) References Cited

U.S. PATENT DOCUMENTS

| | | | | |
|---|---|---|---|---|
| 7,535,709 | B2* | 5/2009 | Fan | G06F 1/20 |
| | | | | 165/104.33 |
| 8,120,910 | B2 | 2/2012 | Hong | |
| 8,405,983 | B2* | 3/2013 | Chen | G06F 1/181 |
| | | | | 361/690 |
| 8,475,119 | B2* | 7/2013 | Li | G06F 1/20 |
| | | | | 415/147 |
| 8,950,726 | B2* | 2/2015 | Sun | F04D 25/14 |
| | | | | 248/674 |
| 9,055,693 | B2* | 6/2015 | Arreola | H05K 7/20172 |
| 9,173,323 | B2* | 10/2015 | Liao | H05K 7/20181 |
| 10,238,006 | B2* | 3/2019 | Huang | F04D 25/14 |
| 10,852,029 | B2* | 12/2020 | Tsai | F24F 13/075 |
| 10,888,018 | B2* | 1/2021 | Yu | F04D 25/14 |
| 11,089,713 | B2* | 8/2021 | Escamilla | F04D 29/4246 |
| 11,191,183 | B1* | 11/2021 | Lin | H05K 7/20172 |
| 2008/0145246 | A1 | 6/2008 | Lee et al. | |
| 2011/0228477 | A1 | 9/2011 | Hong | |
| 2012/0138262 | A1* | 6/2012 | Zhang | F04D 25/0613 |
| | | | | 165/67 |
| 2016/0165750 | A1* | 6/2016 | Tang | H05K 7/20172 |
| | | | | 361/692 |
| 2020/0116385 | A1* | 4/2020 | Tsai | F04D 25/14 |

FOREIGN PATENT DOCUMENTS

| | | | |
|---|---|---|---|
| KR | 102058079 | 12/2019 | |
| TW | M391269 | 10/2010 | |
| TW | M532715 | 11/2016 | |
| TW | I678470 | 12/2019 | |
| WO | WO-2012092904 A2 * | 7/2012 | ......... H05K 7/20172 |

OTHER PUBLICATIONS

"Office Action of Taiwan Counterpart Application", dated May 4, 2021, p. 1-p. 9.

* cited by examiner

FAN MODULE AND ELECTRONIC DEVICE

CROSS-REFERENCE TO RELATED APPLICATION

This application claims the priority benefit of Taiwan application serial no. 109111702, filed on Apr. 8, 2020. The entirety of the above-mentioned patent application is hereby incorporated by reference herein and made a part of this specification.

BACKGROUND

Technical Field

The invention relates to a fan module and an electronic device, and particularly relates to a fan module and an electronic device using the fan module.

Description of Related Art

Along with improvement of computing performance and increase of computing capacity of computers and servers, computers and servers generate a large amount of heat during operations. In order to quickly dissipate the heat out of the computers and the servers, the computers and the servers are mostly equipped with fan modules to dissipate hot air through operations of the fan modules, or send external cold air into the computers and the servers.

At present, hot-plugging technology has been widely applied in computers and servers to facilitate operations such as installation, removal, replacement, expansion or maintenance of personnel under a condition of continuous power supply. Regarding a hot-plugging fan module, a casing of the computer or the server is provided with a corresponding vent hole to facilitate the hot-plugging fan module to expel the hot air inside the casing of the computer or the server, or send the external cold air into the casing of the computer or the server. However, once the hot-plugging fan module stops operating or the hot-plugging fan module is removed from the casing, the personnel must immediately perform an operation of closing the vent hole, otherwise airflow may flow back into the casing of the computer or the server.

SUMMARY

The invention is directed to a fan module and an electronic device, which is adapted to prevent airflow from flowing back.

The invention provides a fan module including a blade mechanism, a switch component and a fan. The blade mechanism includes a frame, a positioning bracket and a plurality of blades, wherein the positioning bracket is movably connected to the frame, and the blades are movably connected to the positioning bracket and the frame. The frame has a through hole. The switch component is connected to the positioning bracket. The fan is detachably disposed at one side of the through hole, and the positioning bracket and the blades are located at another side of the through hole. The switch component is located on an assembly path of the fan. In a first mode, any two of the blades adjacent to each other are stacked with each other to close the through hole. In a second mode, the fan pushes the switch component to drive the positioning bracket to drive the blades, such that the blades have a rotational degree of freedom relative to the positioning bracket, or the blades rotate relative to the frame to open the through hole.

The invention provides an electronic device including a casing and a fan module. The casing has an assembly space and a vent hole connected to the assembly space. The fan module is detachably assembled in the assembly space. The fan module includes a blade mechanism, a switch component and a fan. The blade mechanism includes a frame, a positioning bracket and a plurality of blades, wherein the positioning bracket is movably connected to the frame, and the blades are movably connected to the positioning bracket and the frame. The frame has a through hole aligned with the vent hole. The switch component is connected to the positioning bracket. The fan is detachably disposed at one side of the through hole, and the positioning bracket and the blades are located at another side of the through hole. The switch component is located on an assembly path of the fan, and the fan is detachably disposed between the vent hole and the through hole. In a first mode, any two of the blades adjacent to each other are stacked with each other to close the through hole. In a second mode, the fan pushes the switch component to drive the positioning bracket to drive the blades, such that the blades have a rotational degree of freedom relative to the positioning bracket, or the blades rotate relative to the frame to open the through hole.

Based on the above description, since the fan module and the electronic device of the invention are integrated with an anti-backflow design, when the fan stops running or the fan is removed from the casing, a path used for airflow ventilation in the casing is blocked immediately to prevent the airflow from flowing backward and prevent foreign matters from entering the casing.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
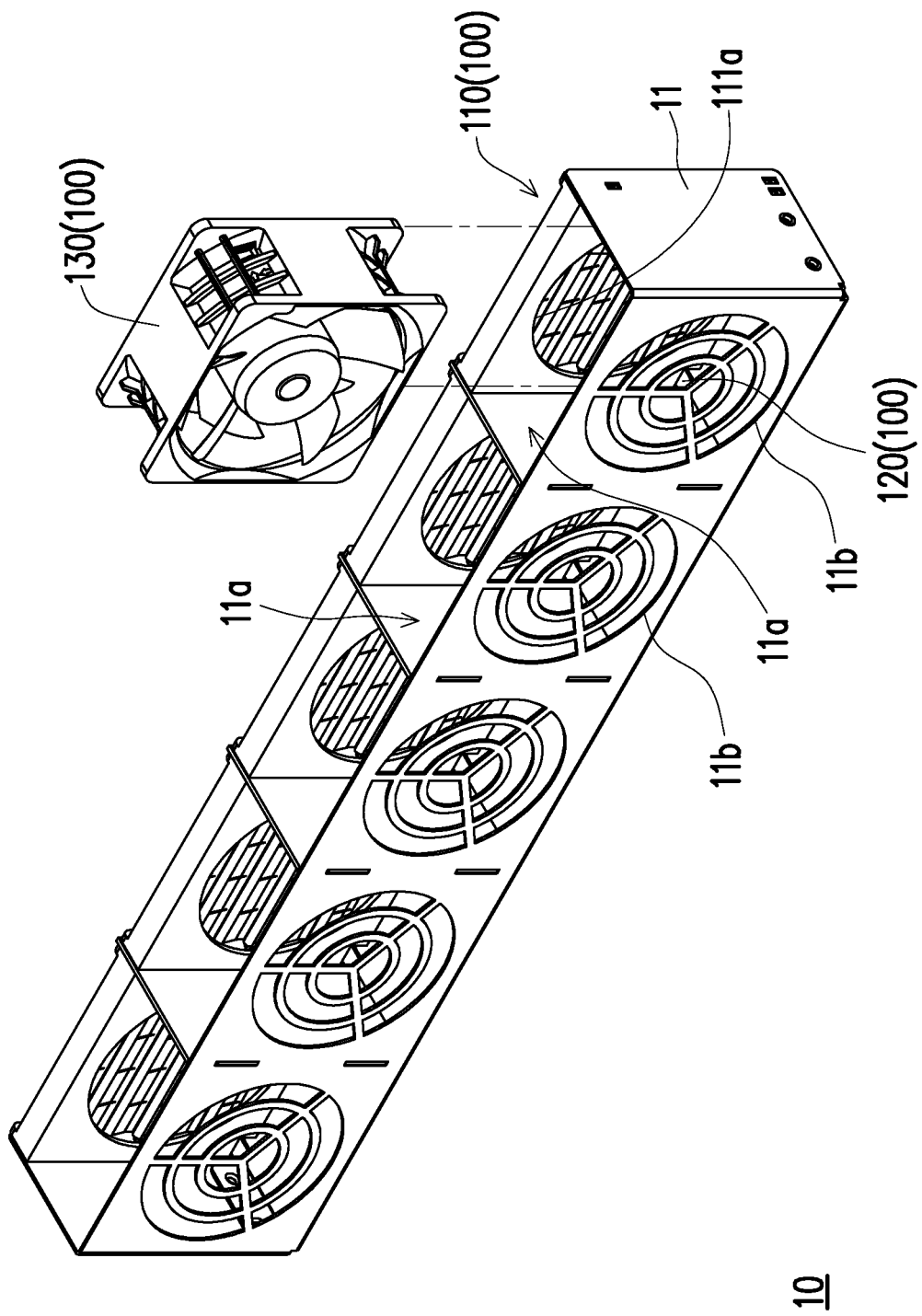
FIG. 1 and FIG. 2 are schematic diagrams of an electronic device in two different modes according to an embodiment of the invention.
Figure 2:
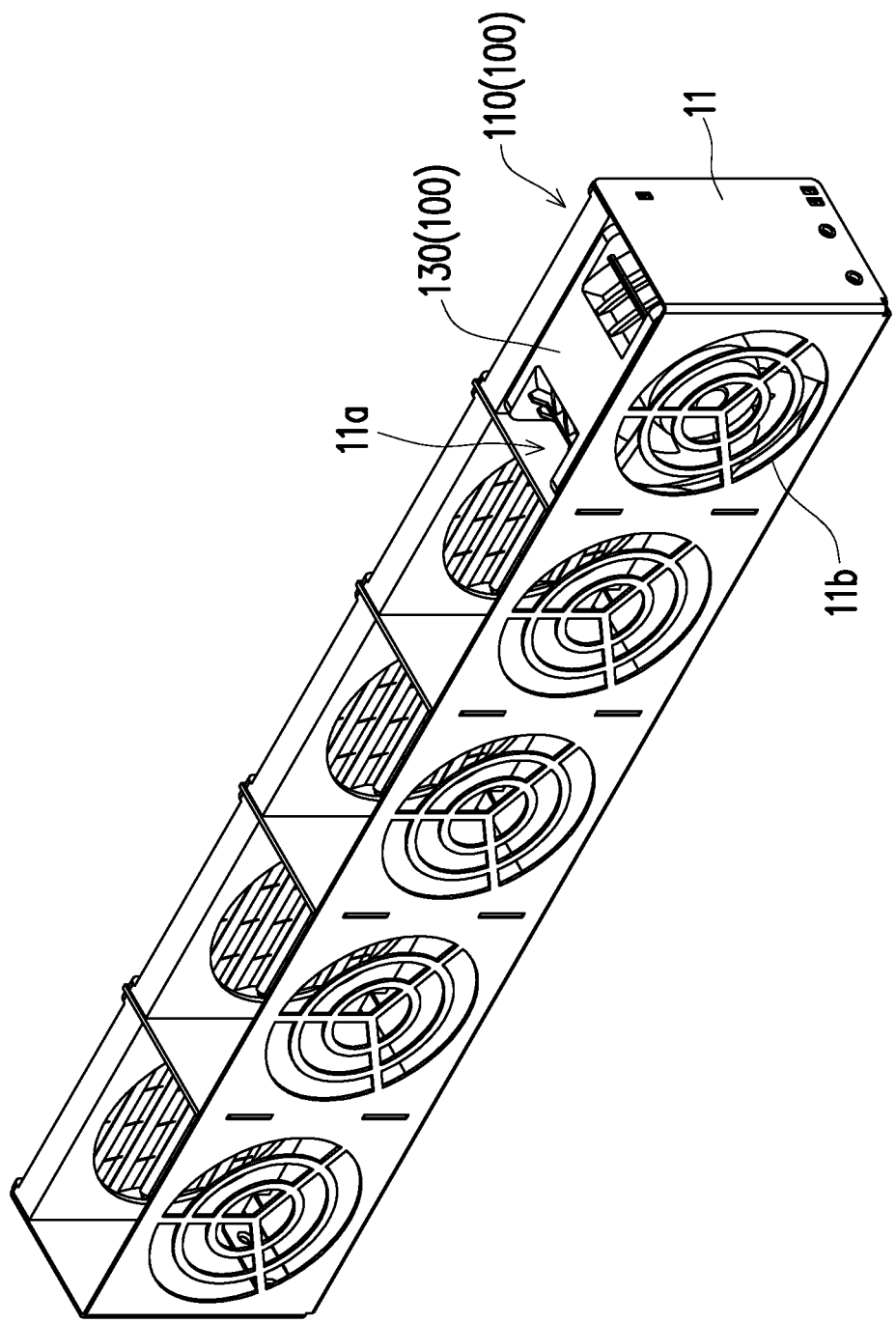

FIG. 1 and FIG. 2 are schematic diagrams of an electronic device in two different modes according to an embodiment of the invention. Referring to FIG. 1 and FIG. 2, in the embodiment, the electronic device 10 may be a notebook computer or a server, and the electronic device 10 includes a casing 11 and a fan module 100. The casing 11 may be a part of a casing of the notebook computer or the server, and the casing 11 has an assembly space 11a and a vent hole 11b connected to the assembly space 11a. A number of the assembly spaces 11a and a number of the vent holes 11b may be plural, and the number of the assembly spaces 11a is equal to the number of the vent holes 11b.

The assembly space 11a is configured to accommodate the fan module 100, where the fan module 100 may be a hot-plugging fan module, but the invention is not limited thereto, and a number of the fan modules 100 may be adjusted according to actual needs. When the fan module 100 is mounted in the assembly space 11a and operates, hot air inside the casing 11 may be dissipated to the outside through the assembly space 11a and the vent hole 11b, or external cold air may be sent to the inside of the casing 11 through the vent hole 11b and the assembly space 11a. Since the fan module 100 is detachably assembled in the assembly space 11a, the fan module 100 may be entirely or partially moved away from the assembly space 11a according to actual needs, or the fan module 100 may be entirely or partially mounted in the assembly space 11a.

Figure 3:
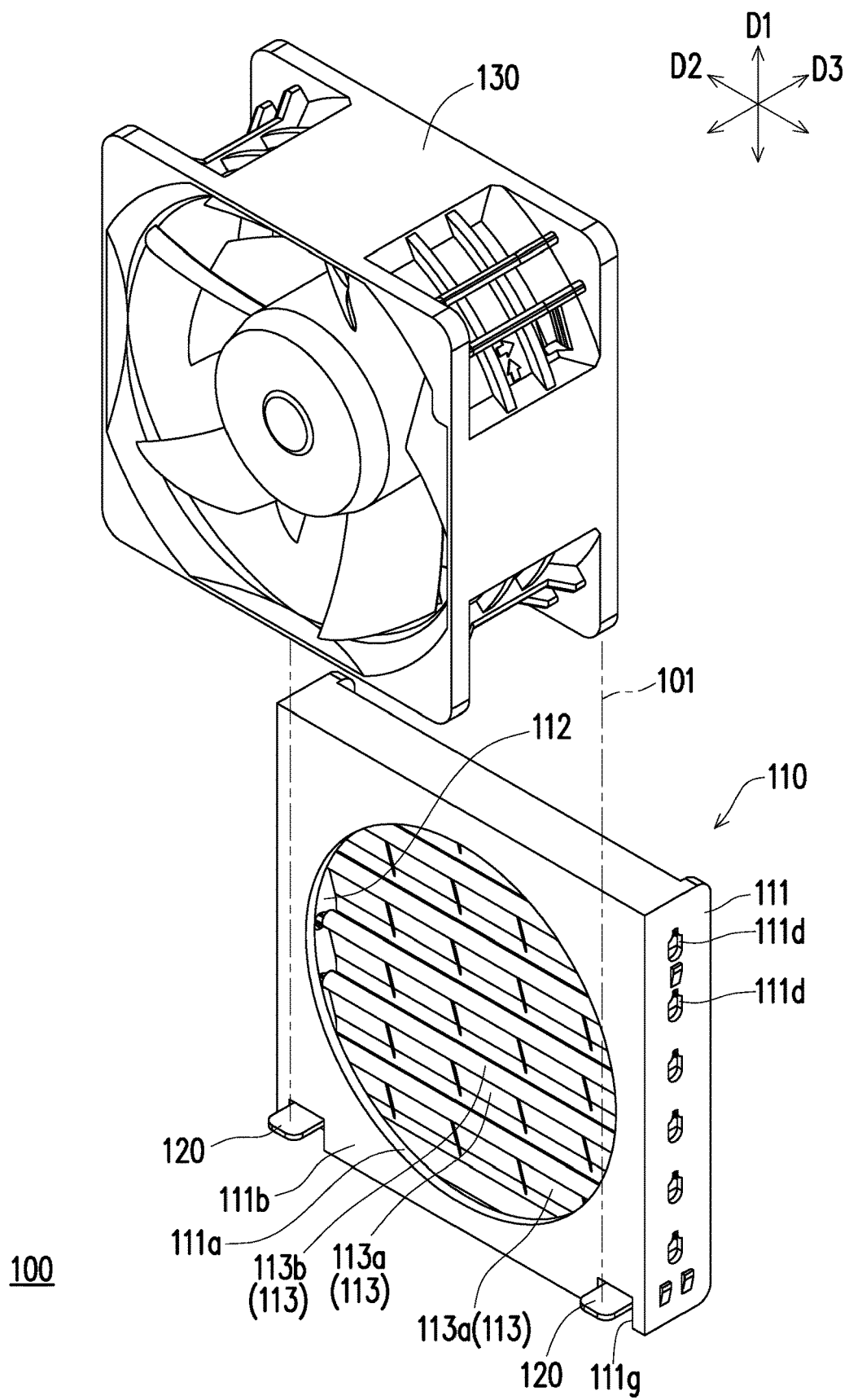
FIG. 3 is a schematic diagram of a fan module of FIG. 1 in a first mode.
Figure 4:
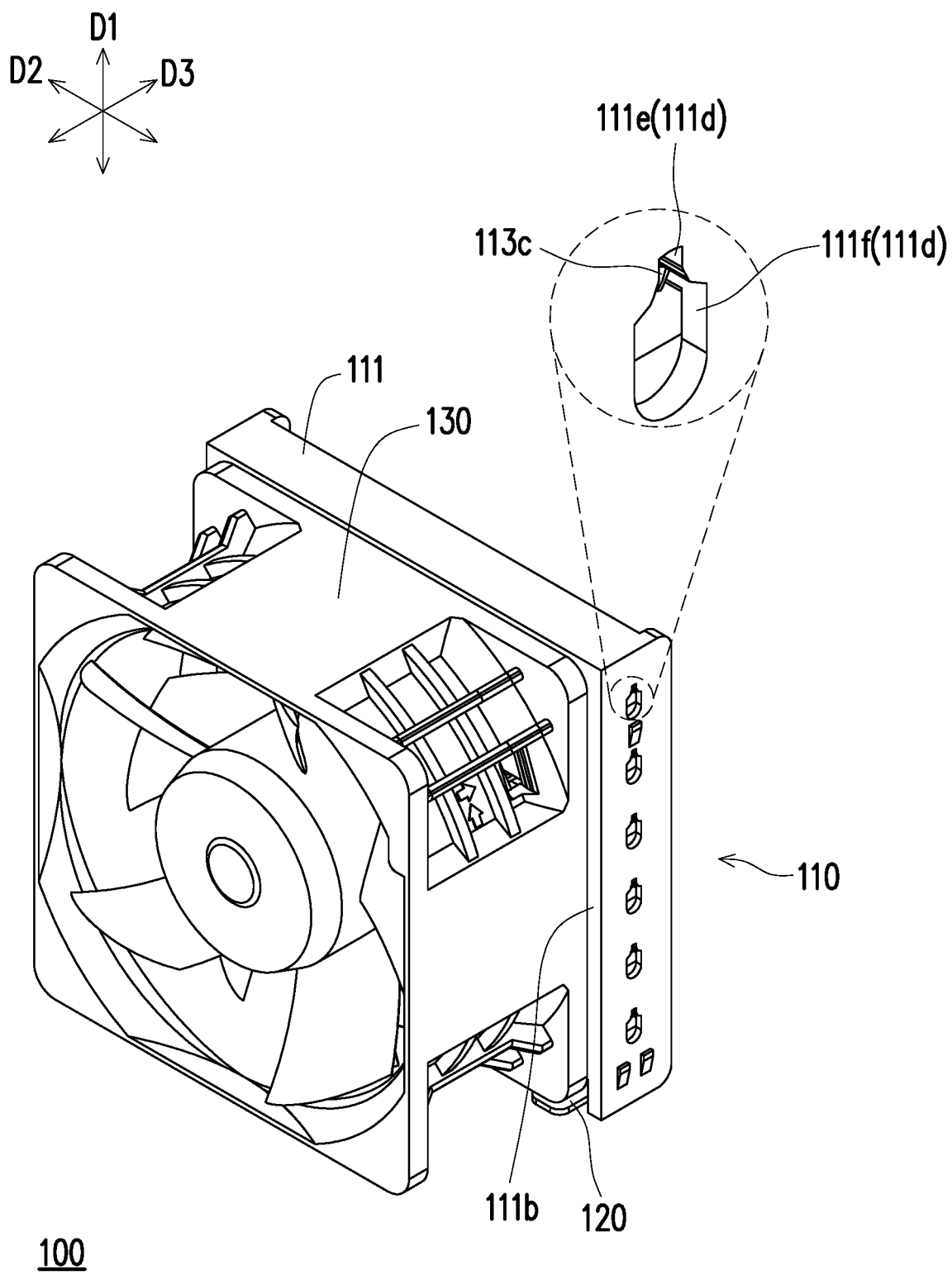
FIG. 4 is a schematic diagram of a fan module of FIG. 2 in a second mode.

FIG. 3 is a schematic diagram of the fan module of FIG. 1 in the first mode. FIG. 4 is a schematic diagram of the fan module of FIG. 2 in the second mode. Referring to FIG. 1 to FIG. 4, in the embodiment, the fan module 100 includes a blade mechanism 110, a switch component 120 and a fan 130, where the blade mechanism 110 and the fan 130 may be detachably assembled in the assembly space 11a, and the fan 130 is located between the vent hole 11b and the blade mechanism 110. In a normal state, the blade mechanism 110 is mounted in the assembly space 11a, and the fan 130 may be mounted in the assembly space 11a or moved out of the assembly space 11a according to actual needs.

The fan 130 may be an axial-flow fan, and when the fan 130 stops running or the fan 130 is moved out of the assembly space 11a, the blade mechanism 110 located in the assembly space 11a may immediately block a path used for airflow ventilation in the casing 11 to prevent airflow from flowing backwards, and prevent foreign matters from entering the inside of the casing 11. For example, the vent hole 11b and the assembly space 11a may constitute a part of the path used for airflow ventilation in the casing 11.

For example, the blade mechanism 110 may be switched between a closed mode and an open mode, the blade mechanism 110 in the closed mode blocks the path used for airflow ventilation in the casing 11, while the blade mechanism 110 in the open mode may maintain the path used for airflow ventilation in the casing 11 to be unobstructed.

Figure 5:
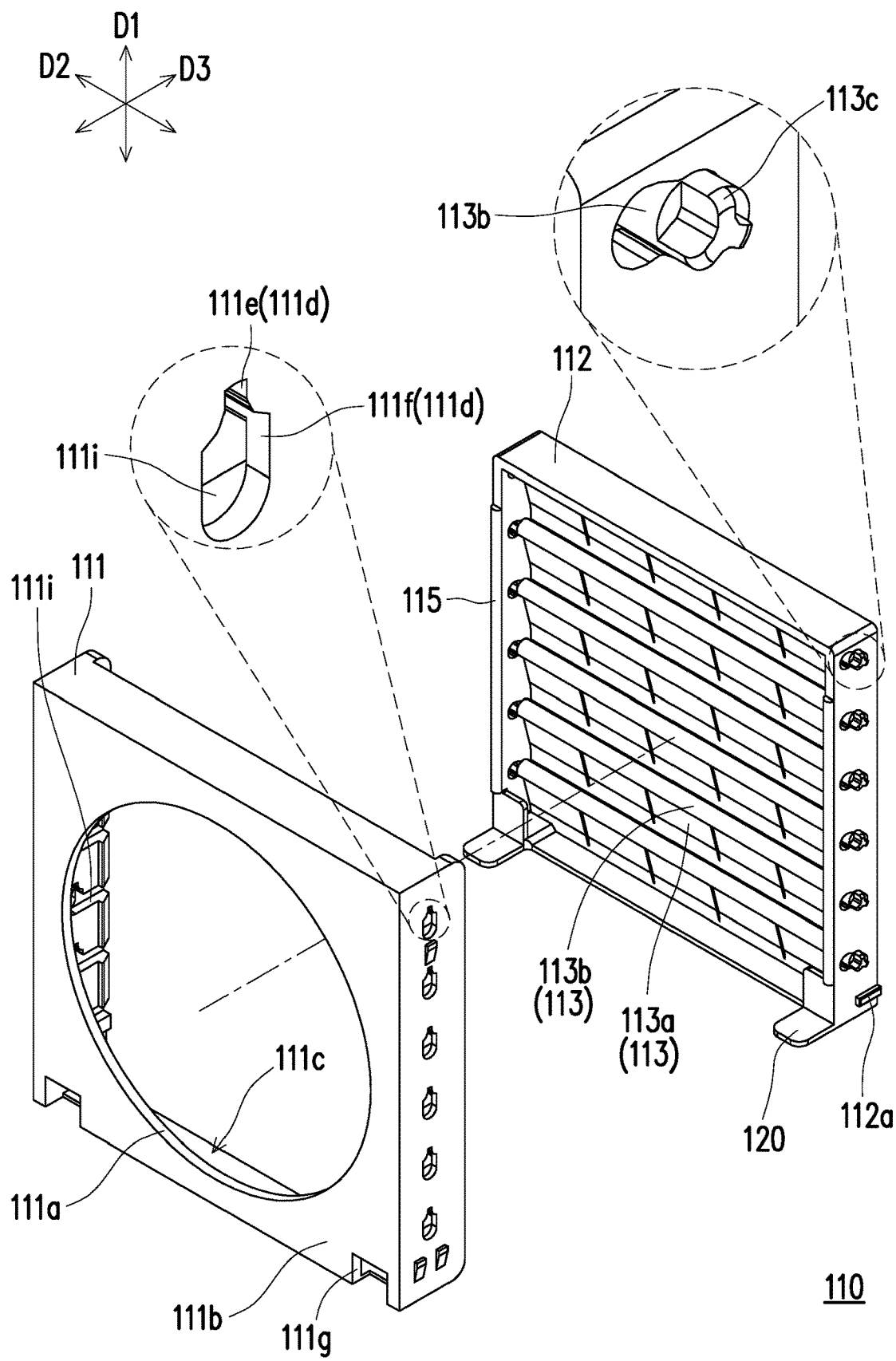
FIG. 5 is an exploded view of a blade mechanism of FIG. 3.

FIG. 5 is an exploded view of the blade mechanism of FIG. 3. Referring to FIG. 3 to FIG. 5, in the embodiment, the blade mechanism 110 includes a frame 111, a positioning bracket 112 and a plurality of blades 113, where the positioning bracket 112 is movably connected to the frame 111, and the blades 113 are movably connected to the positioning bracket 112 and the frame 111.

In detail, the positioning bracket 112 is configured to slide relative to the frame 111 along a first direction D1, where the positioning bracket 112 is a hollow structure, and the blades 113 are arranged on the positioning bracket 112 along the first direction D1. Each of the blades 113 includes a blade body 113a and a rotating shaft 113b, and the rotating shafts 113b are pivotally connected to the positioning bracket 112. Therefore, the blades 113 may slide relative to the frame 111 along with the positioning bracket 112, and the blade bodies 113a may be rotated relative to the positioning bracket 112 through the rotating shafts 113b. On the other hand, the frame 111 has a hollow structure, and has a through hole 111a aligned with the vent hole 11b. The fan 130 is detachably disposed at one side of the through hole 111a, and the positioning bracket 112 and the blades 113 are located at another side of the through hole 111a.

Particularly, a rotation reference axis of the rotating shaft 113b is parallel to a second direction D2, and the first direction D1 is perpendicular to the second direction D2.

For example, the positioning bracket 112 is provided with a convex portion 115 extending along the first direction D1, and one side of the frame 111 facing the positioning bracket 112 is provided with a sliding rail (not shown) corresponding to the convex portion 115, and the sliding rail (not shown) extends along the first direction D1. Based on the cooperation of the convex portion 115 of the positioning bracket 112 and the sliding rail (not shown) of the frame 111, it helps the personnel to install the positioning bracket 112 to a positioning position, or helps improving stability of the positioning bracket 112 when the positioning bracket 112 slides relative to the frame 111.

As shown in FIG. 1 and FIG. 3, in the first mode, the fan 130 is located outside the assembly space 11a, and the blade mechanism 110 is in the closed mode. At this moment, any two of the blade bodies 113a adjacent to each other are stacked with each other to close the through hole 111a. Further, since any two of the adjacent blade bodies 113a are stacked with each other, a path for external airflow flowing to the inside of the casing 11 through the through hole 111a is blocked by the blade bodies 113a.

In the embodiment, the frame 111 further has an assembly surface 111b and an assembly groove 111c opposite to the assembly surface 111b, where the assembly surface 111b faces the vent hole 11b, and the assembly surface 111b is connected to the assembly groove 111c through the through hole 111a. The fan 130 is detachably disposed on the assembly surface 111b, and is detachably disposed between the vent hole 11b and the through hole 111a. In the first mode, the fan 130 is moved away from the assembly surface 111b, and is moved out from a position between the vent hole 11b and the through hole 111a.

Figure 6:
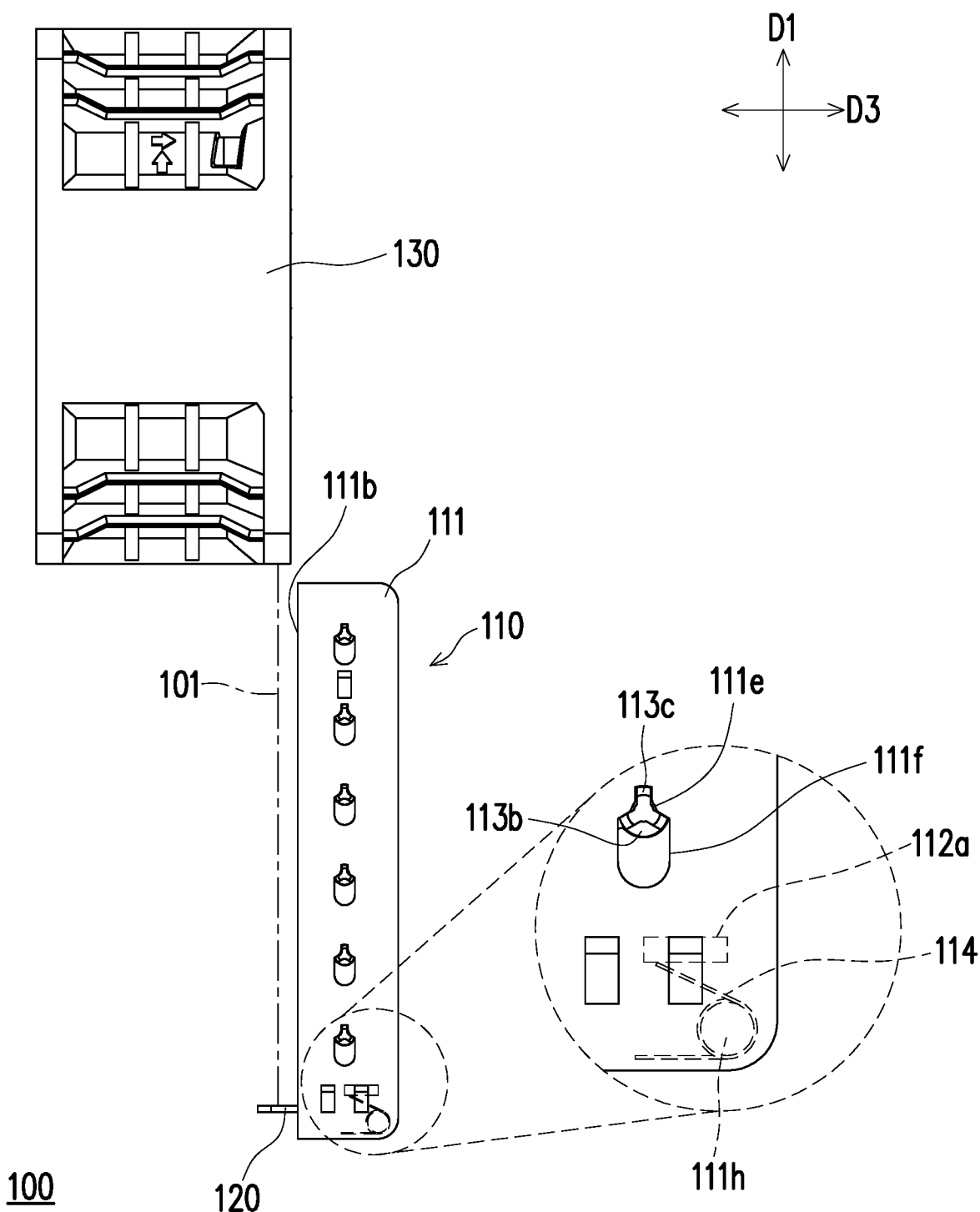
FIG. 6 is a schematic side view of the fan module of FIG. 3.
Figure 7:
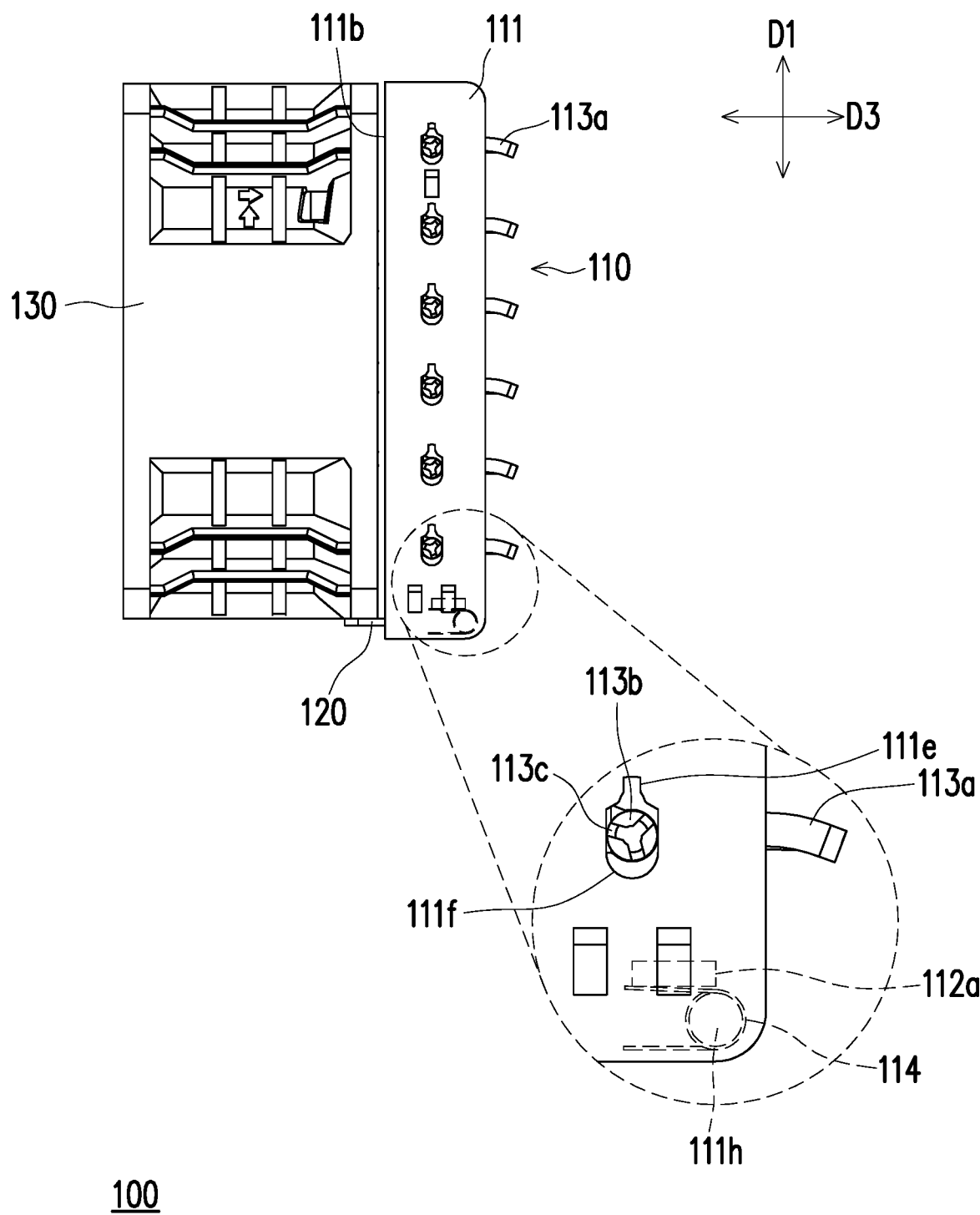
FIG. 7 is a schematic side view of the fan module of FIG. 4.
Figure 8:
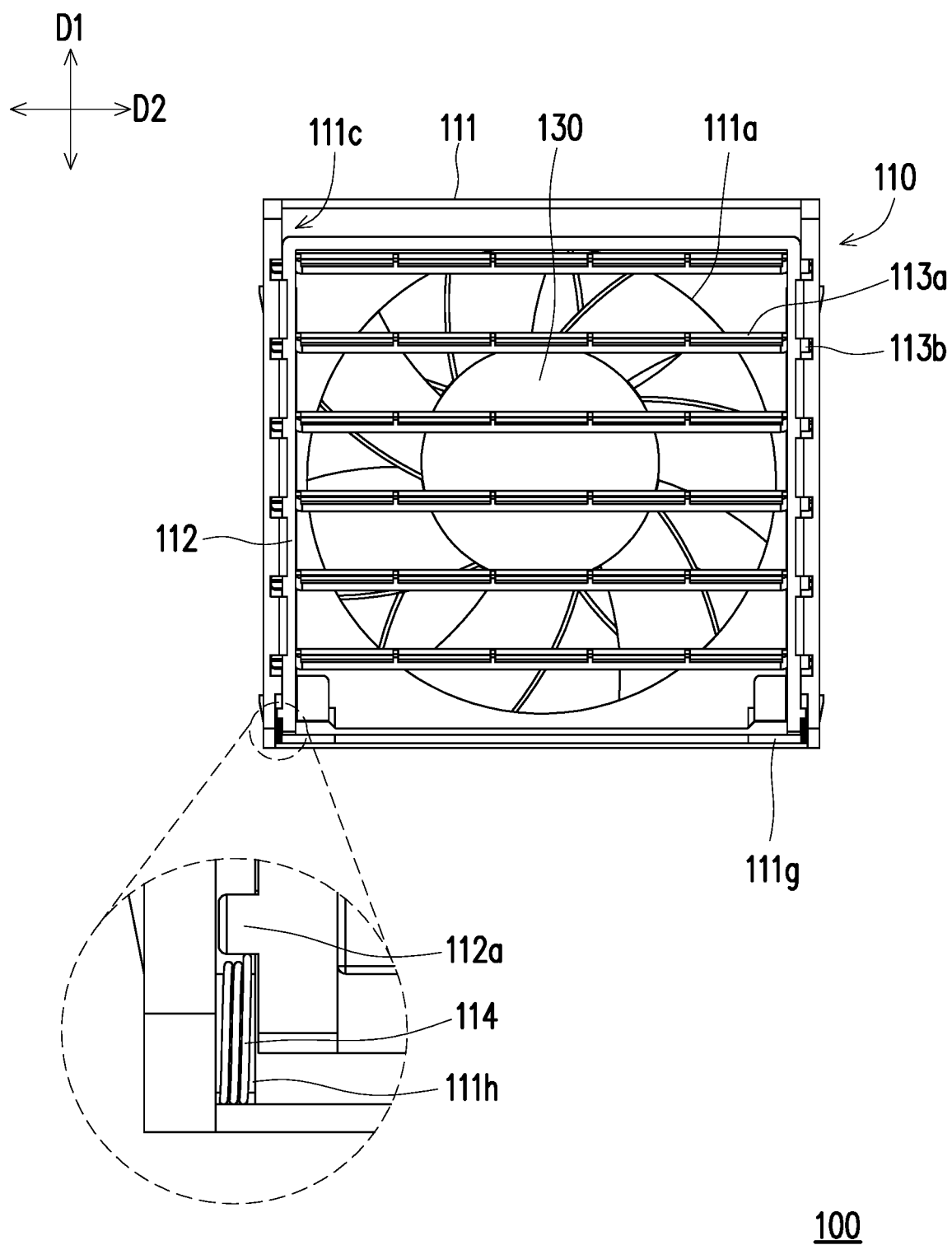
FIG. 8 is a schematic back view of the fan module of FIG. 4.

FIG. 6 is a schematic side view of the fan module of FIG. 3. FIG. 7 is a schematic side view of the fan module of FIG. 4. FIG. 8 is a schematic back view of the fan module of FIG. 4. Referring to FIG. 3 to FIG. 6, the positioning bracket 112 and the blades 113 are disposed in the assembly groove 111c, and the frame 111 surrounds the positioning bracket 112. Further, the rotating shafts 113b of the blades 113 are pivotally disposed on a sidewall of the positioning bracket 112, and penetrate through the sidewall of the positioning bracket 112 to connect a sidewall of the frame 111. Further, the sidewall of the frame 111 has a plurality of assembly holes 111d corresponding to the rotating shafts 113b, where the assembly holes 111d are arranged along the first direction D1, and the rotating shafts 113b are inserted into the assembly holes 111d.

In the embodiment, each of the assembly holes 111d has a restriction region 111e and an active region 111f connected to the restriction region 111e, and each of the rotating shafts 113b may slide relative to the frame 111 along with the positioning bracket 112, so as to move between the restriction region 111e and the active region 111f. In the first mode, the rotating shafts 113b of the blades 113 are located at the restriction regions 111e of the assembly holes 111d, and the restriction regions 111e of the assembly holes 111d are structurally interfered with the rotating shafts 113b of the blades 113 to prevent the rotating shafts 113b of the blades 113 from rotating relative to the positioning bracket 112. In this way, each blade body 113a is temporarily unable to be rotated relative to the positioning bracket 112 through the rotating shaft 113b, such that any two of the adjacent blade bodies 113a are kept in a state of stacking with each other.

For example, each of the rotating shafts 113b has a locking protrusion 113c (as shown in FIG. 5), and each of the restriction regions 111e has a locking groove, and a shape of each locking protrusion 113c matches a shape of the corresponding restriction region 111e. When each rotating shaft 113b is located at the restriction region 111e of the assembly hole 111d, the locking protrusion 113c is engaged with the locking groove to produce structural interference to prevent the rotating shaft 113b of each blade 113 from rotating relative to the positioning bracket 112.

As shown in FIG. 3, FIG. 5 and FIG. 6, the switch component 120 is connected to the positioning bracket 112, where the switch component 120 and the positioning bracket 112 are formed integrally, and the switch component 120 is located on an assembly path 101 of the fan 130. As shown in FIG. 2, FIG. 4, FIG. 7 and FIG. 8, in the second mode, the fan 130 is mounted in the assembly space 11a, and the blade mechanism 110 is switched to the open mode. When the fan 130 is mounted in the assembly space 11a, the fan 130 pushes the switch component 120 to drive the positioning bracket 112 to slide relative to the frame 111. During such process, the blades 113 slide relative to the frame 111 in the first direction D1 along with the positioning bracket 112, and the rotating shaft 113b of each blade 113 is moved from the restriction region 111e to the active region 111f.

As shown in FIG. 4 and FIG. 7, after the rotating shaft 113b of each blade 113 is moved from the restriction region 111e to the active region 111f, the structural interference between the rotating shaft 113b of each blade 113 and the restriction region 111e is released, and an outer dimension (or an outer diameter) of the rotating shaft 113b of each blade 113 is smaller than an inner dimension (or an inner diameter) of the active region 111f. Therefore, the rotating shafts 113b moved to the active regions 111f have a rotational degree of freedom relative to the positioning bracket 112, and the blade bodies 113a may be rotated relative to the positioning bracket 112 through the rotating shafts 113b.

As shown in FIG. 2, FIG. 7 and FIG. 8, since the rotating shafts 113b have a rotational degree of freedom relative to the positioning bracket 112, when the fan 130 is running, the external cold air may be sent to the inside of the casing 11 through the assembly space 11a, the vent hole 11b, and the through hole 111a. At this time, the airflow sent to the inside of the casing 11 pushes the blade bodies 113a, and the blade bodies 113a are rotated relative to the positioning bracket 112 to open the through hole 111a. Further, after the blade bodies 113a are rotated relative to the positioning bracket 112, any two of the adjacent blade bodies 113a are separated from each other, and a path along which an external airflow flows into the casing 11 through the through hole 111a is no longer blocked by the blade bodies 113a.

Once the fan 130 stops running, the blade bodies 113a are rotated back to initial positions under the function of gravity. Finally, any two of the adjacent blade bodies 113a are again stacked with each other to immediately close the through hole 111a.

As shown in FIG. 3 and FIG. 5, in the embodiment, the frame 111 further has an opening 111g on the assembly surface 111b, where the opening 111g is further connected to the assembly groove 111c, and the switch component 120 passes through the opening 111g and protrudes out of the assembly surface 111b. As shown in FIG. 2, FIG. 4 and FIG. 7, when the fan 130 is attached to the assembly surface 111b and is moved relative to the frame 111 for being mounted in the assembly space 11a, the fan 130 may have a mechanical contact with the switch component 120 and push the switch component 120 to move toward a bottom surface of the assembly space 11a. At the same time, the switch component 120 drives the positioning bracket 112 to move toward the bottom surface of the assembly space 11a.

For example, the switch component 120 protrudes out from the positioning bracket 112 and extends outward along a third direction D3 to pass through the opening 111g and protrude out from the assembly surface 111b. In particular, the first direction D1, the second direction D2 and the third direction D3 are perpendicular to each other.

As shown in FIG. 6 to FIG. 8, the blade mechanism 110 further includes a spring 114, where the spring 114 may be a torsion spring, and the spring 114 is located in the assembly groove 111c, and two ends of the spring 114 respectively lean against the positioning bracket 112 and the frame 111. For example, the sidewall of the positioning bracket 112 has a protrusion 112a extending toward the frame 111, and the sidewall of the frame 111 has a convex pillar 111h extending toward the positioning bracket 112. The spring 114 is sleeved on the convex pillar 111h, where one end of the spring 114 leans against the protrusion 112a, and another end of the spring 114 leans against a bottom wall of the frame 111.

As shown in FIG. 2 and FIG. 6 to FIG. 8, when the fan 130 is mounted in the assembly space 11a, the positioning bracket 112 is moved toward the bottom wall of the frame 111, and the spring 114 is pressed by the protrusion 112a to generate elastic deformation. Once the fan 130 is moved out of the assembly space 11a, an elastic force of the spring 114 is exerted on the protrusion 112a to drive the positioning bracket 112 to move toward a top wall of the frame 111 and move the rotating shaft 113b of each blade 113 from the active region 111f to the restriction region 111e. At this time, the restriction regions 111e of the assembly holes 111d are structurally interfered with the rotating shafts 113b of the blades 113 to prevent the rotating shafts 113b of the blades 113 from rotating relative to the positioning bracket 112.

As shown in FIG. 5, the sidewall of the frame 111 has a plurality of sliding grooves 111i located in the assembly groove 111c, where the sliding grooves 111i are arranged along the first direction D1, and the sliding grooves 111i are connected to the assembly holes 111d. An extending direction of each of the sliding grooves 111i is parallel to the third direction D3, and based on the guidance of the sliding grooves 111i, the rotating shafts 113b may be accurately mounted to the assembly holes 111d. During a process of mounting the positioning bracket 112 and the blades 113 in the assembly groove 111c, the rotating shafts 113b slide to the assembly holes 111d via the sliding grooves 111i along the third direction D3.

Other embodiments are provided below, the same or similar design principles in the embodiments are not repeated, and differences between the embodiments are mainly described.

Figure 9:
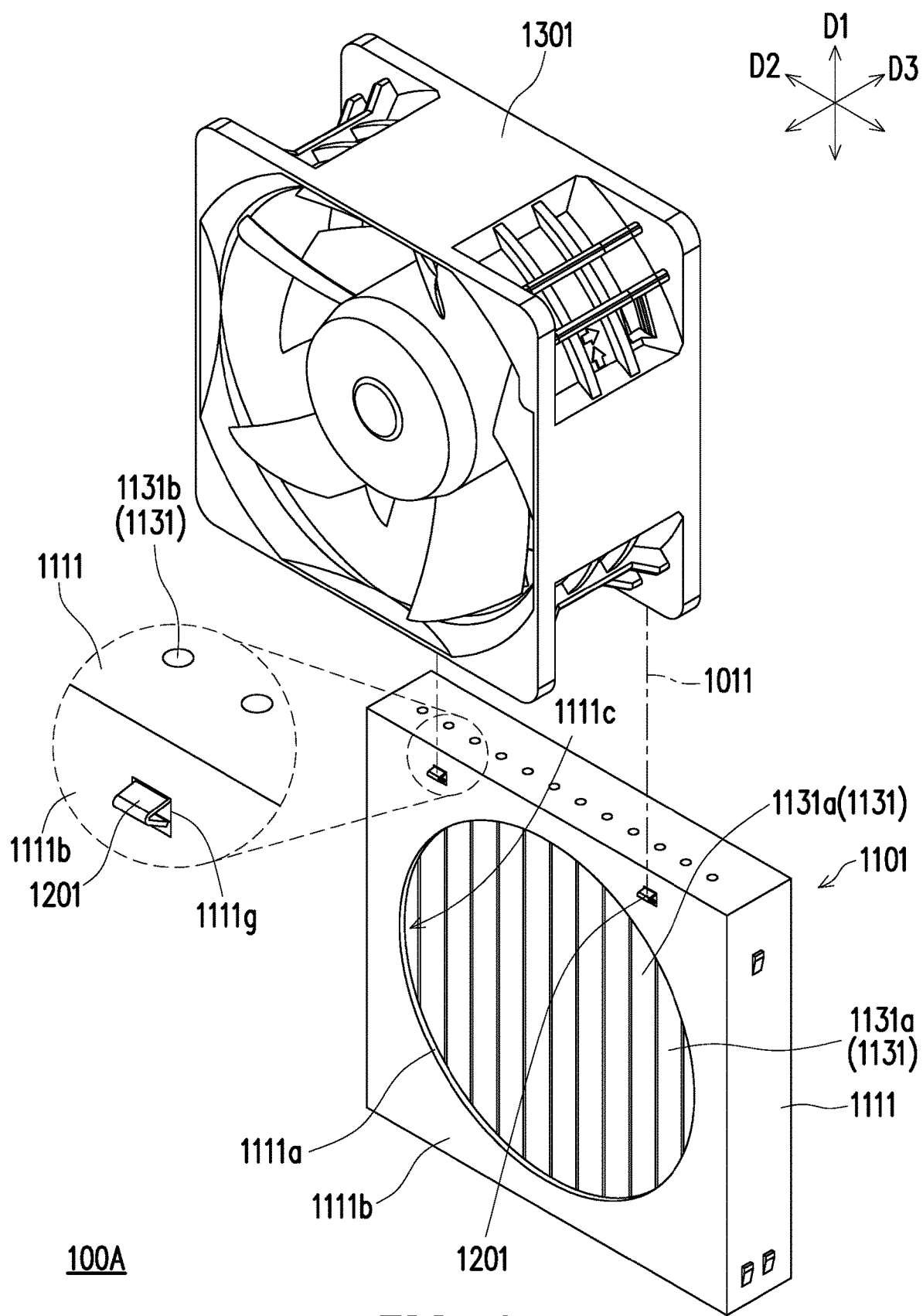
FIG. 9 and FIG. 10 are schematic diagrams of a fan module in two different modes according to another embodiment of the invention.
Figure 10:
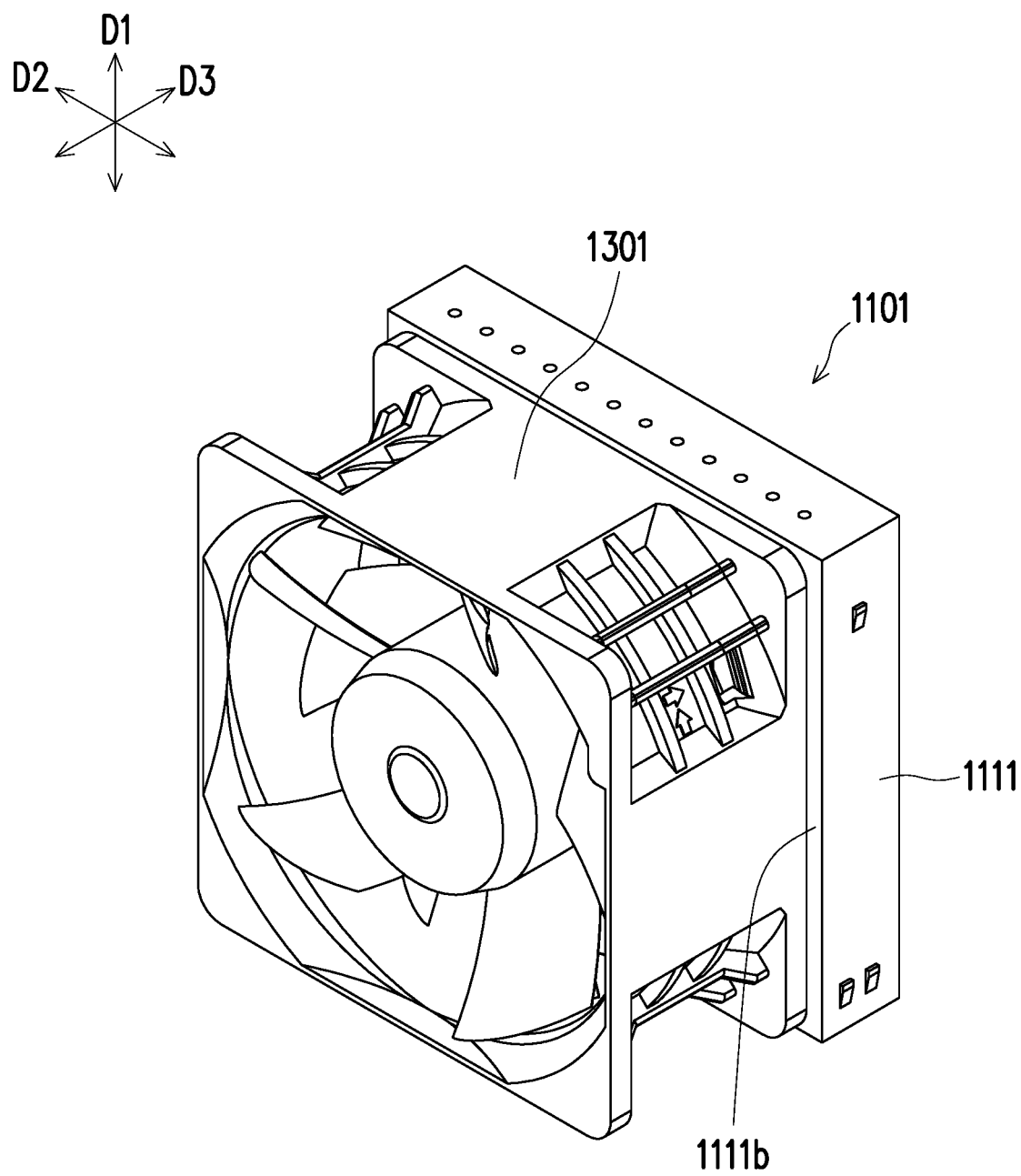
Figure 11:
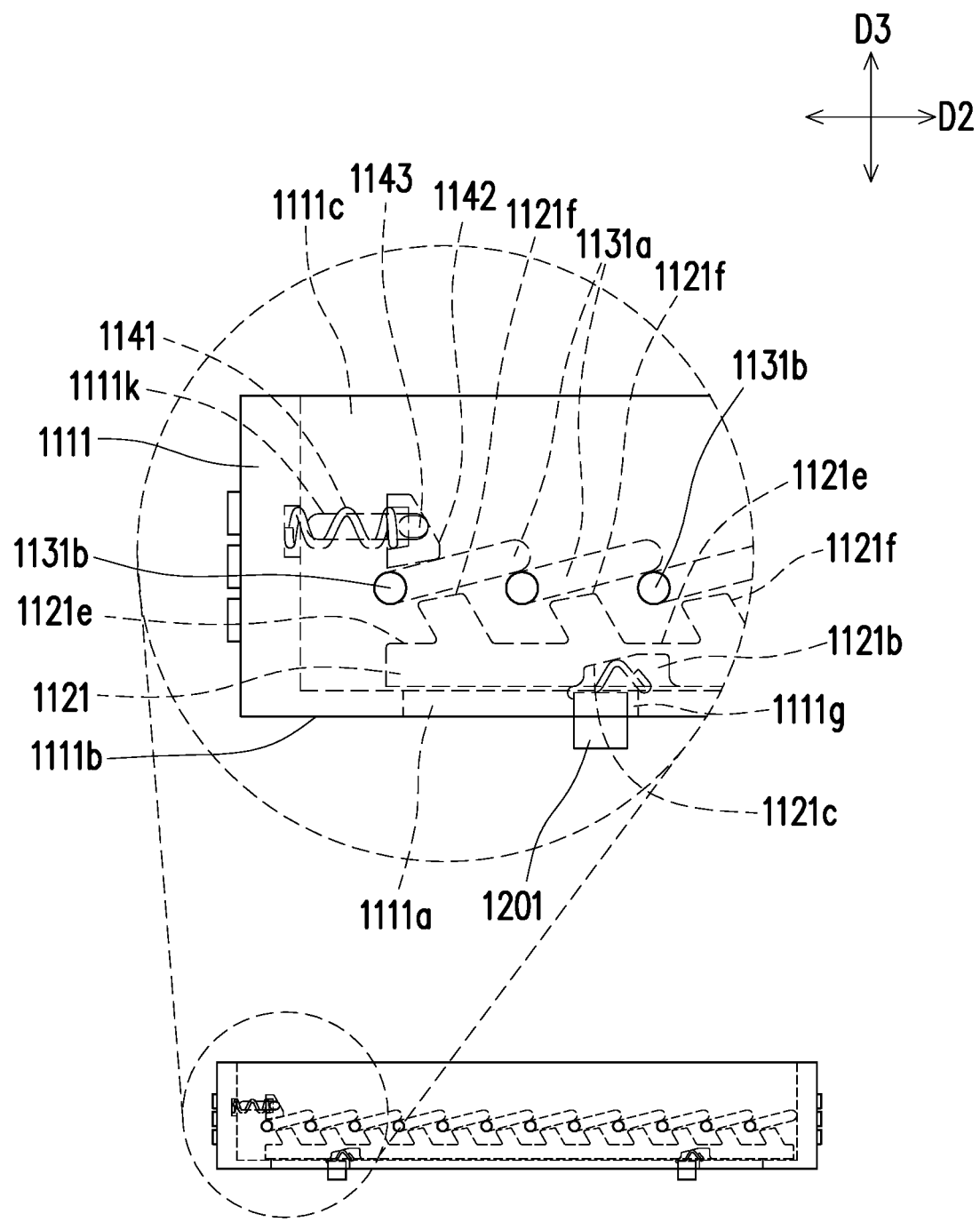
FIG. 11 is a schematic top view of a blade mechanism of FIG. 9 in the first mode.
Figure 12:
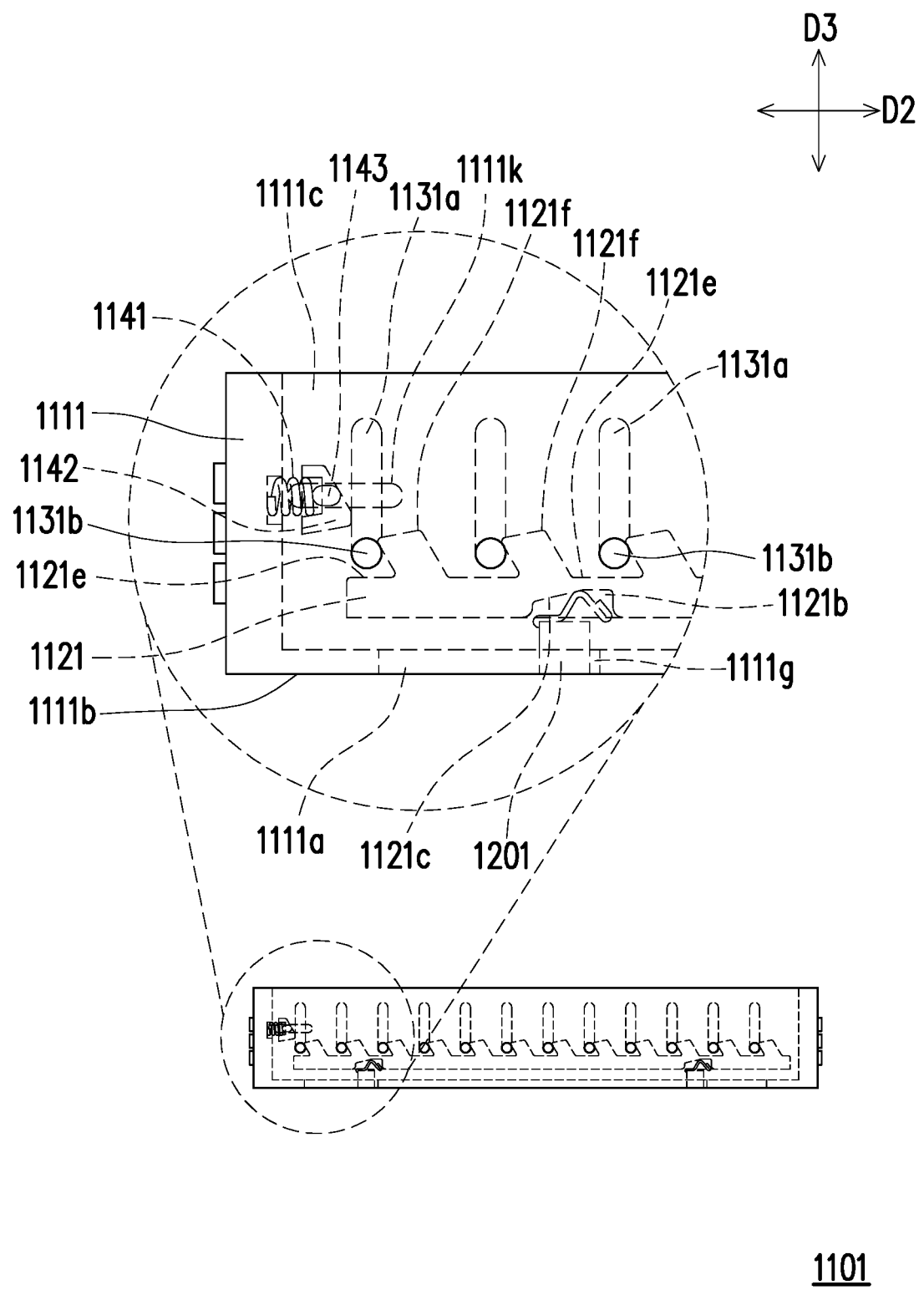
FIG. 12 is a schematic top view of a blade mechanism of FIG. 10 in the second mode.
Figure 13:
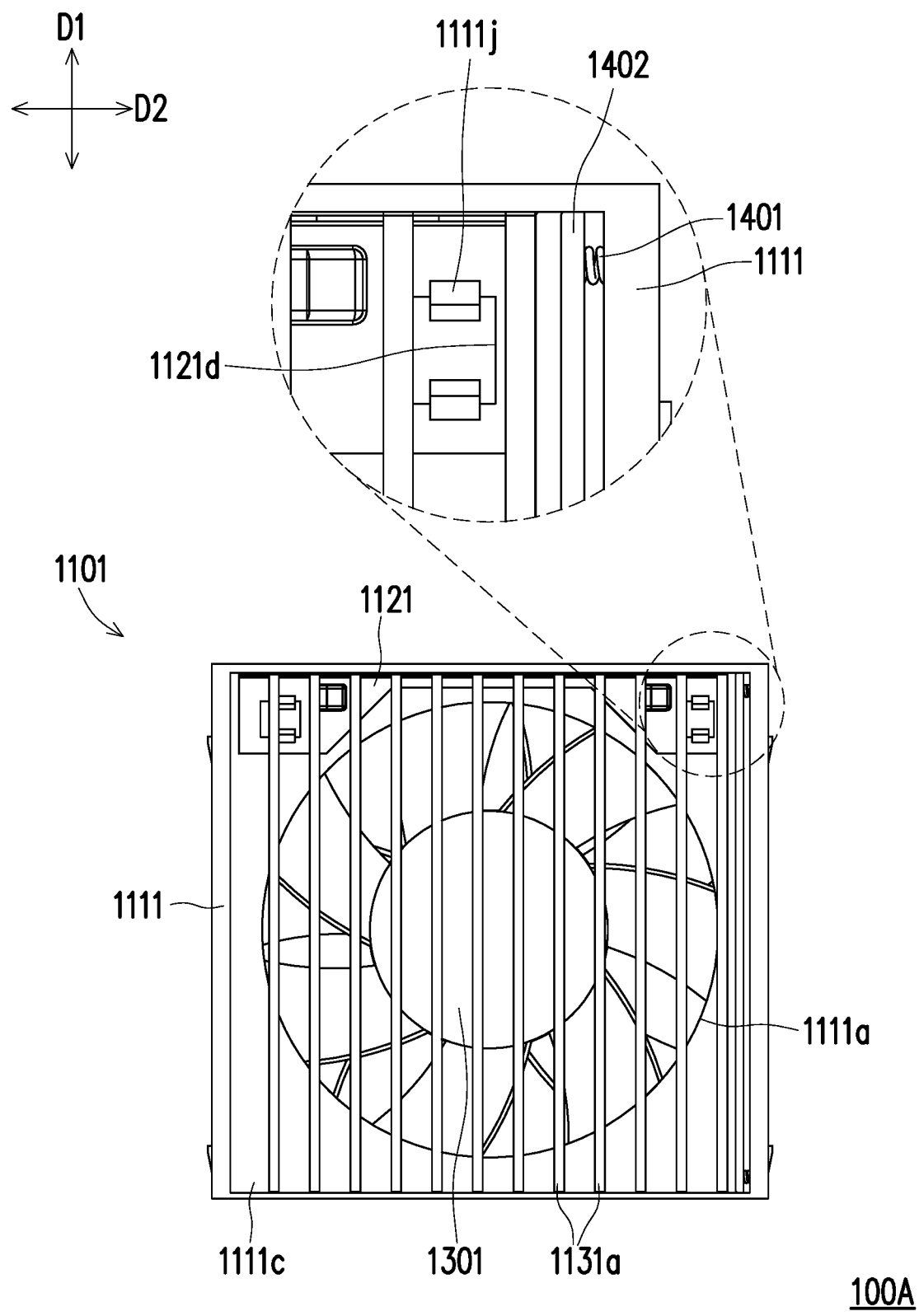
FIG. 13 is a schematic back view of the fan module of FIG. 10.

FIG. 9 and FIG. 10 are schematic diagrams of a fan module in two different modes according to another embodiment of the invention. FIG. 11 is a schematic top view of a blade mechanism of FIG. 9 in the first mode. FIG. 12 is a schematic top view of a blade mechanism of FIG. 10 in the second mode. FIG. 13 is a schematic back view of the fan module of FIG. 10.

Referring to FIG. 9 and FIG. 10, a fan module 100A of the embodiment may be applied to the casing 11 shown in FIG. 1 and FIG. 2, and a blade mechanism 1101 of the fan module 100A is different to the blade mechanism 110 of the fan module 100 of the previous embodiment.

Referring to FIG. 9 to FIG. 12, in the embodiment, a plurality of blades 1131 of the blade mechanism 1101 are arranged on a frame 1111 along the second direction D2, where rotating shafts 1131b of the blades 1131 are pivotally connected to the frame 1111, and a rotation reference axis of each rotating shaft 1131b is parallel to the first direction D1. On the other hand, a positioning bracket 1121 is closer to a through hole 1111a compared with the blades 1131, where the positioning bracket 1121 is slidably disposed inside a top wall of the frame 1111, and the positioning bracket 1121 has a slidable degree of freedom relative to the frame 1111 along the second direction D2 and the third direction D3.

The positioning bracket 1121 has a groove 1121b facing the frame 1111, and a part of a switch component 1201 is located in the groove 1121b, and slidably leans against a bottom surface 1121c of the groove 1121b. Further, the groove 1121b is aligned with an opening 1111g, where a first end of the switch component 1201 is located in the groove 1121b, and slidably leans against the positioning bracket 1121. A second end of the switch component 1201 passes through the opening 1111g, where the second end of the switch component 1201 protrudes out from an assembly surface 1111b, and is located on an assembly path 1011 of a fan 1301.

For example, the first end of the switch component 1201 may adopt a structure design of a curved surface, a cambered surface, or an inclined surface, etc., so as to smoothly push the positioning bracket 1121. On the other hand, the second end of the switch component 1201 may adopt a structure design of a curved surface, a cambered surface, or an inclined surface, etc., so as to be smoothly pushed by the fan 1301, and the fan 1301 smoothly moves through a location where the switch component 1201 is located to avoid a situation that the fan 1301 is jammed by the switch component 1201.

In the embodiment, the bottom surface 1121c of the groove 1121b includes a slope section, and the first end of the switch component 1201 may slidably lean against the slope section. Further, a normal direction of the slope section is not parallel to the second direction D2 and the third direction D3, and when the switch component 1201 is moved along the third direction D3 and pushes against the slope section through the first end, the positioning bracket 1121 is driven to slide relative to the frame 1111 along a direction parallel to the normal direction of the slope section. As shown in FIG. 13, the positioning bracket 1121 further has a through groove 1121d facing the frame 1111, and the frame 1111 further has a position limiting hook 1111j protruding into an assembly groove 1111c. The position limiting hook 1111j passes through the through groove 1121d to prevent the positioning bracket 1121 from being separated from the frame 1111.

In the first mode, any two of the adjacent blade bodies 1131a are stacked with each other to close the through hole 1111a. Further, since any two of the adjacent blade bodies 1131a are stacked with each other, a path for external airflow flowing to the inside of the casing through the through hole 1111a is blocked by the blade bodies 1131a.

Referring to FIG. 11, in the embodiment, the positioning bracket 1121 includes a plurality of concave portions 1121e and a plurality of convex portions 1121f, where the concave portions 1121e and the convex portions 1121f are arranged in interleaving, and the concave portions 1121e and the convex portions 1121f face the blades 1131. In the concave portions 1121e and the convex portions 1121f that are arranged in interleaving, any two of the adjacent convex portions 1121f are separated by one concave portion 1121e, or any two of the adjacent concave portions 1121e are separated by one convex portion 1121f.

The rotating shafts 1131b of the blades 1131 are aligned with the concave portions 1121e. In the first mode, the rotating shafts 1131b are located outside the concave portions 1121e. On the other hand, the convex portions 1121f lean against the blade bodies 1131a, or the blade bodies 1131a are located on a moving path of the convex portions 1121f.

Referring to FIG. 11 to FIG. 13, in the second mode, the fan 1301 pushes the switch component 1201 to drive the positioning bracket 1121 to move toward the blades 1131 and push the blade bodies 1131a through the convex portions 1121f, such that the blade bodies 1131a are rotated relative to the frame 1111 to open the through hole 1111a, and the rotating shafts 1131b are accommodated in the concave portions 1121e. Further, after the blade bodies 1131a are pushed by the convex portions 1121f to rotate relative to the frame 1111, any two of the adjacent blade bodies 1131a are separated from each other, and the path for the external airflow flowing to the inside of the casing through the through hole 1111a is no longer blocked by the blade bodies 1131a, or a path for the hot air inside the casing being discharged to the outside through the through hole 1111a is no longer blocked by the blade bodies 1131a.

In the second mode, each blade body 1131a is pushed by the convex portion 1121f, and each rotating shaft 1131b is located in the concave portion 1121e, such that the state that any two of the adjacent blade bodies 1131a are separated from each other may be maintained.

In the embodiment, the blade mechanism 1101 further includes a spring 1141 and a reset component 1142, where the spring 1141 and the reset component 1142 are disposed in the assembly groove 1111c, and two ends of the spring 1141 respectively lean against the sidewall of the frame 1111 and the reset component 1142. The spring 1141 may be a compression spring, and the reset component 1142 leans against one of the blade bodies 1131a to ensure that the blade bodies 1131a are maintained in the state of stacking with each other.

When the blade bodies 1131a are rotated relative to the frame 1111 to separate any two of the adjacent blade bodies 1131a from each other, the blade body 1131a leaning against the reset component 1142 pushes the reset component 1142, such that the reset component 1142 slides along the second directions D2. At this time, the spring 1141 is pressed by the reset component 1142 to produce elastic deformation.

Once the fan 1301 is moved away from the blade mechanism 1101, an elastic force of the spring 1141 is applied to the reset component 1142 to drive the reset component 1142 to slide back to an initial position. At this time, the blade body 1131a leaning against the reset component 1142 is pushed by the reset component 1142 to rotate relative to the frame 1111, and is rotated back to an initial position. Meanwhile, the blade body 1131a leaning against the reset component 1142 drives the other blade bodies 1131a to rotate relative to the frame 1111, such that the other blade bodies 1131a are rotated back to initial positions. Finally, any two of the adjacent blade bodies 1131a are stacked with each other again to immediately close the through hole 1111a.

For example, one of any two adjacent blade bodies 1131a (which is referred to as a first blade body hereinafter) is located on a rotation path of the other one of the any two adjacent blade bodies 1131a (which is referred to as a second blade body hereinafter), and when the second blade body is rotated back to the initial position, the second blade body may be in mechanical contact with the first blade body and drives the first blade body to rotate back to the initial position.

It should be noted that the top wall and the bottom wall of the frame 1111 have a guide groove 1111k, where an extending direction of the guide groove 1111k is parallel to the second direction D2. On the other hand, the reset component 1142 has a protruding pin 1143, and the protruding pin 1143 is slidably disposed in the guide groove 1111k to determine a sliding direction of the reset component 1142.

In summary, since the fan module and the electronic device of the invention are integrated with an anti-backflow design, when the fan stops running or the fan is removed from the casing, the blade mechanism may immediately block a path used for airflow ventilation in the casing, so as to prevent the airflow from flowing backward and prevent foreign matters from entering the casing.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A fan module, comprising:
   a blade mechanism, comprising a frame, a positioning bracket, and a plurality of blades, wherein the positioning bracket is movably connected to the frame, the blades are movably connected to the positioning bracket and the dame, and the frame has a through hole;
   a switch component, connected to the positioning bracket; and
   a fan, detachably disposed at one side of the through hole, and the positioning bracket and the blades being located at another side of the through hole, wherein the switch component is located on an assembly path of the fan,
   in a first mode, any two of the blades adjacent to each other are stacked with each other to close the through hole, and
   in a second mode, the fan pushes the switch component to drive the positioning bracket to drive the blades, such that the blades have a rotational degree of freedom relative to the positioning bracket or the blades rotate relative to the frame to open the through hole.

2. The fan module as claimed in claim 1, wherein the frame further has an assembly surface and an assembly groove opposite to the assembly surface, the assembly surface is connected to the assembly groove through the through hole, the fan is detachably disposed on the assembly surface, and the positioning bracket and the blades are disposed in the assembly groove.

3. The fan module as claimed in claim 2, wherein the frame further has an opening located on the assembly surface and the switch component passes through the opening and protrudes out of the assembly surface.

4. The fan module as claimed in claim 1, wherein each of the blades comprises a blade body and a rotating shaft, the rotating shafts of the blades are pivotally connected to the positioning bracket, and in the first mode, any two of the blade bodies adjacent to each other are stacked with each other to close the through hole.

5. The fan module as claimed in claim 4, wherein the rotating shafts of the blades penetrate through the positioning bracket, the frame further has a plurality of assembly holes corresponding to the rotating shafts, the rotating shafts of the blades are inserted into the assembly holes, and each of the assembly holes has a restriction region and an active region,
   in the first mode, the rotating shafts of the blades are located at the restriction regions of the assembly holes and the restriction regions of the assembly holes are structurally interfered with the rotating shafts of the blades to prevent the rotating shafts of the blades from rotating relative to the positioning bracket, and
   in the second mode, the fan pushes the switch component to drive the positioning bracket to drive the blades, such that the rotating shafts of the blades are moved to the active regions of the assembly holes and the rotating shafts of the blades have a rotational degree of freedom relative to the positioning bracket.

6. The fan module as claimed in claim 4, wherein the blade mechanism further comprises a spring and two ends of the spring respectively lean against the positioning bracket and the frame.

7. The fan module as claimed in claim 1, wherein each of the blades comprises a blade body and a rotating shaft, the rotating shafts of the blades are pivotally connected to the frame, and in the first mode, any two of the blade bodies adjacent to each other are stacked with each other to close the through hole.

8. The fan module as claimed in claim 7, wherein the positioning bracket comprises a plurality of concave portions and a plurality of convex portions, the concave portions and the convex portions are arranged in interleaving, the concave portions and the convex portions face the blades, the rotating shafts of the blades are aligned with the concave portions, and in the second mode, the fan pushes the switch component to drive the positioning bracket to move toward the blades and push the blade bodies through the convex portions, such that the blade bodies rotate relative to the frame to open the through hole and the rotating shafts of the blades are accommodated in the concave portions.

9. The fan module as claimed in claim 7, wherein the positioning bracket has a groove facing the frame, and a part of the switch component is located in the groove and slidably leans against a bottom surface of the groove.

10. The fan module as claimed in claim 7, wherein the blade mechanism further comprises a spring and a reset component, two ends of the spring respectively lean against the frame and the reset component, and the reset component leans against one of the blade bodies.

11. An electronic device, comprising:
    a casing, having an assembly space and a vent hole connected to the assembly space; and a fan module, assembled in the assembly space, comprising:
- a blade mechanism, comprising a frame, a positioning bracket, and a plurality of blades, wherein the positioning bracket is movably connected to the frame, the blades are movably connected to the positioning bracket and the frame, and the frame has a through hole aligned with the vent hole;
- a switch component, connected to the positioning bracket; and
- a fan, detachably disposed at one side of the through hole, and the positioning bracket and the blades being located at another side of the through hole, wherein the switch component is located on an assembly path of the fan and the fan is detachably disposed between the vent hole and the through hole,
- in a first mode, any two of the blades adjacent to each other are stacked with each other to close the through hole, and
- in a second mode, the fan pushes the switch component to drive the positioning bracket to drive the blades, such that the blades have a rotational degree of freedom relative to the positioning bracket or the blades rotate relative to the frame to open the through hole.

12. The electronic device as claimed in claim 11, wherein the frame further has an assembly surface and an assembly groove opposite to the assembly surface, the assembly surface is connected to the assembly groove through the through hole, the fan is detachably disposed on the assembly surface, and the positioning bracket and the blades are disposed in the assembly groove.

13. The electronic device as claimed in claim 12, wherein the frame further has an opening located on the assembly surface and the switch component passes through the opening and protrudes out of the assembly surface.

14. The electronic device as claimed in claim 11, wherein each of the blades comprises a blade body and a rotating shaft, the rotating shafts of the blades are pivotally connected to the positioning bracket, and in the first mode, any two of the blade bodies adjacent to each other are stacked with each other to close the through hole.

15. The electronic device as claimed in claim 14, wherein the rotating shafts of the blades penetrate through the positioning bracket, the frame further has a plurality of assembly holes corresponding to the rotating shafts, the rotating shafts of the blades are inserted into the assembly holes, and each of the assembly holes has a restriction region and an active region,
- in the first mode, the rotating shafts of the blades are located at the restriction regions of the assembly holes and the restriction regions of the assembly holes are structurally interfered with the rotating shafts of the blades to prevent the rotating shafts of the blades from rotating relative to the positioning bracket, and
- in the second mode, the fan pushes the switch component to drive the positioning bracket to drive the blades, such that the rotating shafts of the blades are moved to the active regions of the assembly holes and the rotating shafts of the blades have a rotational degree of freedom relative to the positioning bracket.

16. The electronic device as claimed in claim 14, wherein the blade mechanism further comprises a spring and two ends of the spring respectively lean against the positioning bracket and the frame.

17. The electronic device as claimed in claim 11, wherein each of the blades comprises a blade body and a rotating shaft, the rotating shafts of the blades are pivotally connected to the frame, and in the first mode, any two of the blade bodies adjacent to each other are stacked with each other to close the through hole.

18. The electronic device as claimed in claim 17, wherein the positioning bracket comprises a plurality of concave portions and a plurality of convex portions, the concave portions and the convex portions are arranged in interleaving, the concave portions and the convex portions face the blades, the rotating shafts of the blades are aligned with the concave portions, and in the second mode, the fan pushes the switch component to drive the positioning bracket to move toward the blades and push the blade bodies through the convex portions, such that the blade bodies rotate relative to the frame to open the through hole and the rotating shafts of the blades are accommodated in the concave portions.

19. The electronic device as claimed in claim 17, wherein the positioning bracket has a groove facing the frame, and a part of the switch component is located in the groove and slidably leans against a bottom surface of the groove.

20. The electronic device as claimed in claim 17, wherein the blade mechanism further comprises a spring and a reset component, two ends of the spring respectively lean against the frame and the reset component, and the reset component leans against one of the blade bodies.

* * * * *